United States Patent
Tang et al.

(10) Patent No.: US 10,636,902 B2
(45) Date of Patent: Apr. 28, 2020

(54) MULTIPLE GATED POWER MOSFET DEVICE

(71) Applicant: PTEK TECHNOLOGY CO., LTD., Hsinchu (TW)

(72) Inventors: Ming Tang, Hsinchu (TW); Shih Ping Chiao, Hsinchu (TW)

(73) Assignee: PTEK Technology Co., Ltd., Hsinchu (TW)

( * ) Notice: Subject to any disclaimer, the term of this patent is extended or adjusted under 35 U.S.C. 154(b) by 0 days.

(21) Appl. No.: 16/130,409

(22) Filed: Sep. 13, 2018

(65) Prior Publication Data

US 2020/0091337 A1 Mar. 19, 2020

(51) Int. Cl.
| | |
|---|---|
| H01L 29/66 | (2006.01) |
| H01L 29/78 | (2006.01) |
| H01L 29/10 | (2006.01) |
| H01L 29/06 | (2006.01) |

(52) U.S. Cl.
CPC ...... *H01L 29/7813* (2013.01); *H01L 29/0696* (2013.01); *H01L 29/1095* (2013.01); *H01L 29/7831* (2013.01); *H01L 29/7835* (2013.01)

(58) Field of Classification Search
CPC ............. H01L 29/7813; H01L 29/0696; H01L 29/7831; H01L 29/7835; H01L 29/1095
See application file for complete search history.

(56) References Cited

U.S. PATENT DOCUMENTS

| | | | |
|---|---|---|---|
| 5,973,367 A | 10/1999 | Williams | |
| 7,091,079 B2* | 8/2006 | Chen | H01L 21/823814 257/E21.634 |
| 9,159,786 B2* | 10/2015 | Chen | H01L 29/407 |
| 2006/0099753 A1* | 5/2006 | Chen | H01L 21/823814 438/199 |
| 2008/0116510 A1 | 5/2008 | Kocon et al. | |
| 2008/0258214 A1 | 10/2008 | Jang | |
| 2016/0284838 A1 | 9/2016 | Qin et al. | |

(Continued)

FOREIGN PATENT DOCUMENTS

| | | |
|---|---|---|
| TW | 200832704 A | 8/2008 |
| TW | 201316490 A | 4/2013 |
| TW | 201707210 A | 2/2017 |

*Primary Examiner* — Ismail A Muse

(74) *Attorney, Agent, or Firm* — Muncy, Geissler, Olds & Lowe, P.C.

(57) ABSTRACT

The present disclosure provides a power MOSFET device including a multiple gated transistor disposed over a substrate. The multiple gated transistor includes a first transistor cell having a first drain pillar, a first source pillar, and a first gate conductor disposed between the first drain pillar and the first source pillar. The multiple gated transistor further includes a second transistor cell having a second drain pillar, a second source pillar, and a second gate conductor disposed between the second drain pillar and the second source pillar. The multiple gated transistor further includes a first insulator disposed over the substrate and between the first gate conductor and the second gate conductor. The first insulator electrically insulates the second gate conductor from the first gate conductor. During operation, the first transistor cell and the second transistor cell share a common source and a common drain, and conductive states of the first gate conductor and the second gate conductor are controlled separately.

19 Claims, 6 Drawing Sheets

(56) References Cited

U.S. PATENT DOCUMENTS

| | | | |
|---|---|---|---|
| 2017/0053966 A1* | 2/2017 | Lam | H01L 27/2436 |
| 2018/0130886 A1* | 5/2018 | Kim | H01L 21/823814 |
| 2019/0097004 A1* | 3/2019 | Ina | H01L 29/407 |
| 2019/0131436 A1* | 5/2019 | Cheng | H01L 29/66795 |

* cited by examiner

| Gate 1(101) | Gate 2(102) | Gate 3(103) | $RDS_{ON}$ |
|---|---|---|---|
| ON | ON | ON | $RDS_{ON}\,1 + RDS_{ON}\,2 + RDS_{ON}\,3$ |
| ON | ON | OFF | $RDS_{ON}\,1 + RDS_{ON}\,2$ |
| ON | OFF | ON | $RDS_{ON}\,1 + RDS_{ON}\,3$ |
| OFF | ON | ON | $RDS_{ON}\,2 + RDS_{ON}\,3$ |
| OFF | ON | OFF | $RDS_{ON}\,2$ |
| ON | OFF | OFF | $RDS_{ON}\,1$ |
| OFF | OFF | ON | $RDS_{ON}\,3$ |

FIG. 3

MULTIPLE GATED POWER MOSFET DEVICE

TECHNICAL FIELD

The present disclosure relates to a semiconductor device, and more particularly, to a multiple gated power MOSFET device.

DISCUSSION OF THE BACKGROUND

Power MOSFETs with trench gate structures are widely used for their efficient performance due to their low ON-state resistance ($R_{DSON}$). U.S. patent application No. U.S. Ser. No. 11/930,380 (filed on Oct. 31, 2007) disclosed a trench MOS-gated device that provides a constant $R_{DSON}$. See also U.S. Pat. No. 5,973,367 (issued on Oct. 26, 1999), which disclosed a double-diffused vertical MOSFET in which the gates therein are formed in a trench and separated by a P-doped region. Both of the above patent documents are incorporated herein by reference.

This Discussion of the Background section is for background information only. The statements in this Discussion of the Background are not an admission that the subject matter disclosed in this section constitutes a prior art to the present disclosure, and no part of this section may be used as an admission that any part of this application, including this Discussion of the Background section, constitutes prior art to the present disclosure.

SUMMARY

The present disclosure provides a power MOSFET device including a multiple gated transistor disposed over a substrate. The multiple gated transistor includes a first transistor cell having a first drain pillar, a first source pillar, and a first gate conductor disposed between the first drain pillar and the first source pillar. The multiple gated transistor further includes a second transistor cell having a second drain pillar, a second source pillar, and a second gate conductor disposed between the second drain pillar and the second source pillar. The multiple gated transistor further includes a first insulator disposed over the substrate and between the first gate conductor and the second gate conductor. The first insulator electrically insulates the second gate conductor from the first gate conductor. During operation, the first transistor cell and the second transistor cell share a common source and a common drain, and conductive states of the first gate conductor and the second gate conductor are controlled separately.

In some embodiments, the first gate conductor includes a trench-type gate surrounding the first drain pillar and the first source pillar.

In some embodiments, the first gate conductor includes an insulating material electrically insulating the trench-type gate from the first drain pillar and the first source pillar.

In some embodiments, the first gate conductor includes a gate oxidation layer, a part of which is formed on sidewalls of the first drain pillar and the first source pillar, wherein the gate oxidation layer separates the insulating material from the first drain pillar and the first source pillar.

In some embodiments, the first insulator includes at least one sidewall directly contacting the insulating material and the gate oxidation layer.

In some embodiments, the first insulator includes at least one sidewall directly contacting the substrate.

In some embodiments, a part of the gate oxidation layer of the first gate conductor lies over the substrate and is coplanar with the first insulator.

In some embodiments, the first drain pillar includes a body and a metal silicide layer disposed over the body.

In some embodiments, the body of the first drain pillar includes a lightly doped region and a heavily doped region over the lightly doped region.

In some embodiments, the body of the first drain pillar includes N-type doping.

In some embodiments, the substrate includes a double diffusion layer disposed below the first drain pillar and the first gate conductor.

In some embodiments, the double diffusion layer is disposed below the first insulator.

In some embodiments, the first source pillar includes a body and a metal silicide layer disposed over the body.

In some embodiments, the body of the first source pillar includes a well portion, a central portion disposed over the well portion, and a wall portion surrounding the central portion.

In some embodiments, the central portion includes P-type doping, and the wall portion includes N-type doping.

In some embodiments, the first transistor cell and the second transistor cell are physically insulated by the first insulator.

In some embodiments, the multiple gated transistor further includes a third transistor cell having a third drain pillar, a third source pillar, and a third gate conductor disposed between the third drain pillar and the third source pillar, wherein the third gate conductor is electrically insulated from the first gate conductor and the second conductor structure by a second insulator.

In some embodiments, the first insulator and the second insulator are physically connected.

In some embodiments, the multiple gated transistor further includes a fourth transistor cell having a fourth drain pillar, a fourth source pillar, and the first gate conductor shared with the first transistor, wherein when the conductive states of the first gate conductor and the second gate conductor are both on, the fourth transistor cell and the first transistor cell together provide a resistance that is different from a resistance provided by the second transistor cell.

In some embodiments, the drain pillars and the source pillars of the first transistor cell and the fourth transistor cell are disposed over the substrate in an interlaced manner.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be connected to the figures' reference numbers, which refer to similar elements throughout the description.

FIG. 3 is a table illustrating resistances of the power MOSFET device in FIG. 1 in accordance with some embodiments of the present disclosure.

DETAILED DESCRIPTION

Figure 1:
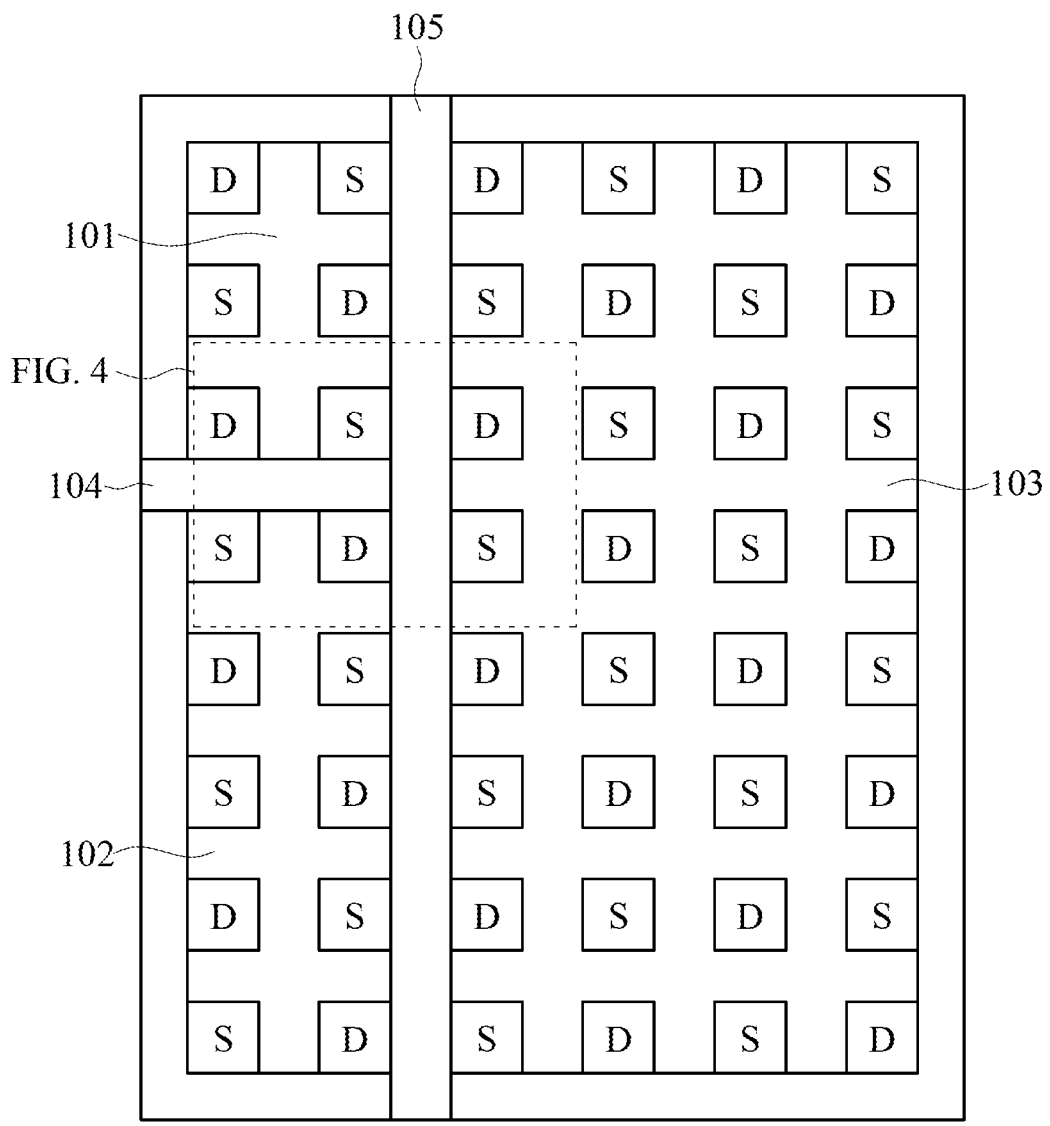
FIG. 1 is a top view of a power MOSFET device in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Referring to FIG. 1, FIG. 1 is a top view of a power MOSFET device in accordance with some embodiments of the present disclosure.

Figure 4:
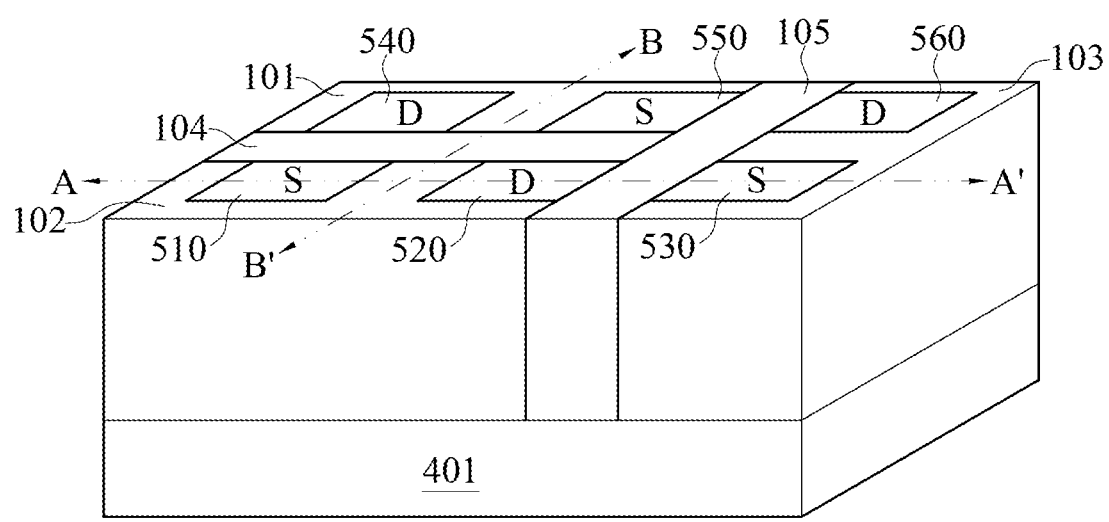
FIG. 4 is a perspective view of a part of the power MOSFET device in FIG. 1 in accordance with some embodiments of the present disclosure.

In an embodiment of the present disclosure, the power MOSFET device comprises a multiple gated transistor 100 disposed over a substrate (substrate 401 in FIG. 4). The multiple gated transistor 100 comprises a first MOSFET unit having a first gate conductor 101, a second MOSFET unit having a second gate conductor 102, and a third MOSFET unit having a third gate conductor 103.

In an embodiment of the present disclosure, the MOSFET units of the multiple gated transistor 100 have different quantities of transistor cells. For example, a transistor cell consists of a drain pillar (denoted as "D" in FIG. 1) and a source pillar (denoted as "S" in FIG. 1). In an embodiment of the present disclosure, the first MOSFET unit having the first gate conductor 101 has three transistor cells, the second MOSFET unit having the second gate conductor 102 has five transistor cells, and the third MOSFET unit having the third gate conductor 103 has sixteen transistor cells.

In an embodiment of the present disclosure, the drain pillars and the source pillars are disposed over the substrate in an interlaced manner. In an embodiment of the present disclosure, the drain pillars and the source pillars are rectangular as viewed from above.

In an embodiment of the present disclosure, the first gate conductor 101, the second gate conductor 102, and the third gate conductor 103 are trench-type gates. In an embodiment of the present disclosure, the trench-type gates surround the drain pillars and the source pillars.

In an embodiment of the present disclosure, the first gate conductor 101, the second gate conductor 102, and the third gate conductor 103 respectively surround different quantities of transistor cells.

In an embodiment of the present disclosure, the different quantities of transistor cells are designed to enable the MOSFET units of the multiple gated transistor 100 to provide different resistances.

Figure 2:
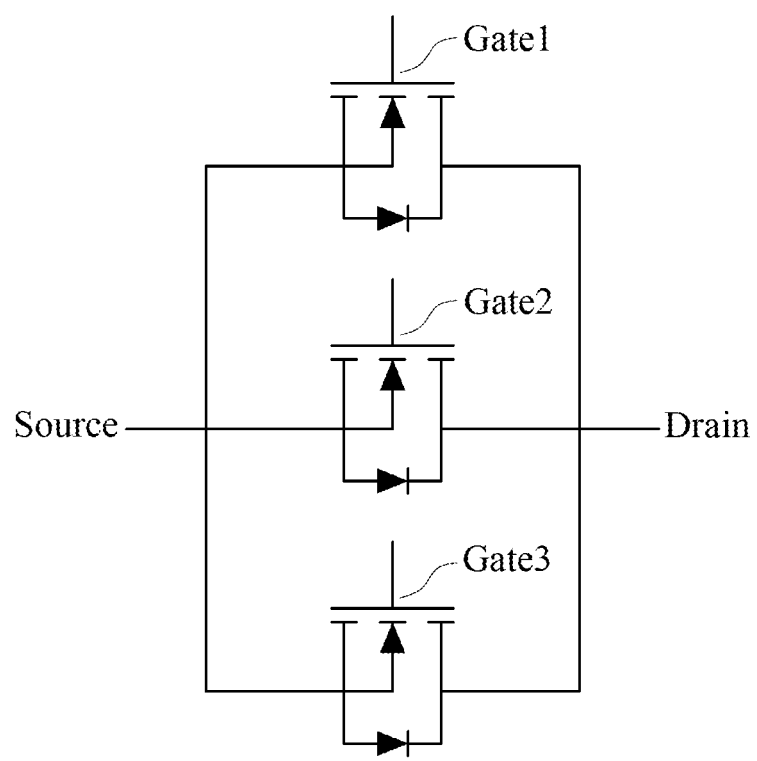
FIG. 2 is a schematic diagram illustrating the connecting configuration of the power MOSFET device in FIG. 1 in accordance with some embodiments of the present disclosure.

Referring to FIG. 2, FIG. 2 is a schematic diagram illustrating the electrical configuration of the power MOSFET device in FIG. 1 in accordance with some embodiments of the present disclosure.

In an embodiment of the present disclosure, the first MOSFET unit, the second MOSFET unit, and the third MOSFET unit of the multiple gated transistor 100 are presented as three MOSFET symbols in FIG. 2. In an embodiment of the present disclosure, the first MOSFET unit, the second MOSFET unit, and the third MOSFET unit share a common source and a common drain.

In an embodiment of the present disclosure, the first gate conductor 101, the second gate conductor 102, and the third gate conductor 103 are denoted in FIG. 2 as "Gate1," "Gate2" and "Gate3." Gate1, Gate2 and Gate3 are controlled separately, that is, the conductive states of first gate conductor 101, the second gate conductor 102, and the third gate conductor 103 can be set as "ON" or "OFF" respectively.

Referring to FIG. 3, FIG. 3 is a table illustrating resistances of the power MOSFET device in FIG. 1 in accordance with some embodiments of the present disclosure.

In an embodiment of the present disclosure, when the conductive state of the first gate conductor 101 is ON, the first MOSFET unit of the multiple gated transistor 100 provides an on-resistance $RDS_{ON}1$. In an embodiment of the present disclosure, the second gate conductor 102 and the third gate conductor 103 can provide on-resistances $RDS_{ON}2$ and $RDS_{ON}3$ when the conductive states thereof are set to ON. In an embodiment of the present disclosure, since the quantities of transistor cells in the MOSFET units are different, the on-resistances $RDS_{ON}1$, $RDS_{ON}2$ and $RDS_{ON}3$ are different from each other. In an embodiment of the present disclosure, the combinations of the on-resistances $RDS_{ON}1$, $RDS_{ON}2$ and $RDS_{ON}3$ form seven possible values of $RDS_{ON}$.

Referring to FIG. 4, FIG. 4 is a perspective view of a part of the power MOSFET device in FIG. 1 in accordance with some embodiments of the present disclosure.

In an embodiment of the present disclosure, the first MOSFET unit has a drain pillar 540 and a source pillar 550, and the first gate conductor 101 surrounds the drain pillar 540 and the source pillar 550. In an embodiment of the present disclosure, the second MOSFET unit has a drain pillar 520 and a source pillar 510, and the second gate conductor 102 surrounds the drain pillar 520 and the source pillar 510. In an embodiment of the present disclosure, the third MOSFET unit has a drain pillar 560 and a source pillar 530, and the third gate conductor 103 surrounds the drain pillar 560 and the source pillar 530.

In an embodiment of the present disclosure, the first gate conductor 101, the drain pillar 540, and the source pillar 550 may together function as a transistor cell.

In an embodiment of the present disclosure, the first gate conductor 101 of the first MOSFET unit is electrically insulated from the second gate conductor 102 of the second MOSFET unit by a first insulator 104 disposed over the substrate 401.

In an embodiment of the present disclosure, the first MOSFET unit and the second MOSFET unit are physically insulated from each other by the first insulator 104.

In an embodiment of the present disclosure, the third gate conductor 103 of the third MOSFET unit is electrically insulated from the first gate conductor 101 and from the second gate conductor 102 by a second insulator 105 disposed over the substrate 401.

In an embodiment of the present disclosure, the first insulator 104 and the second insulator 105 are physically connected.

Figure 5:
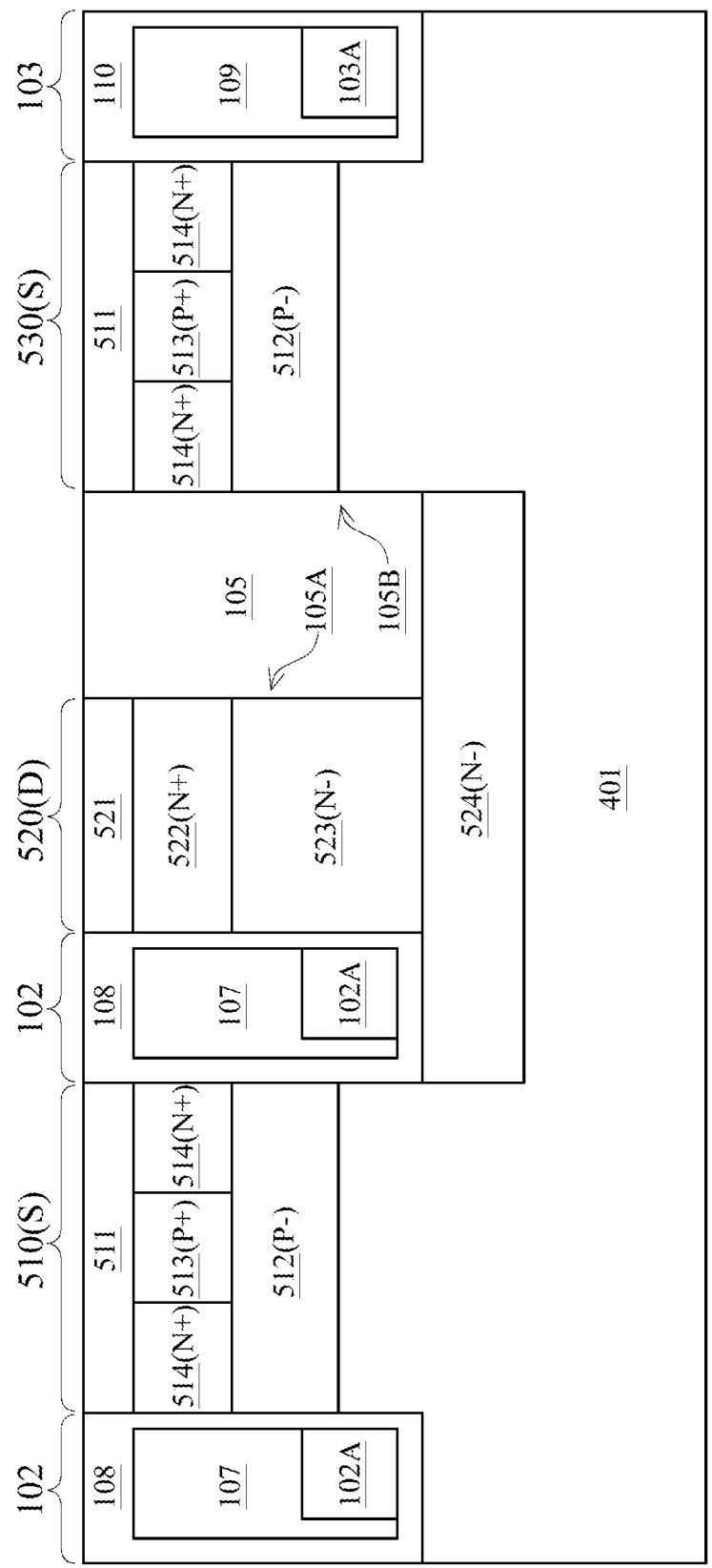
FIG. 5 is a cross-sectional view taken along line A-A' of FIG. 4 in accordance with some embodiments of the present disclosure.

Referring to FIG. 5, FIG. 5 is a cross-sectional view taken along line A-A' of FIG. 4 in accordance with some embodiments of the present disclosure.

In an embodiment of the present disclosure, the second gate conductor 102 comprises an insulating material 107 electrically insulating a trench-type gate 102A from the source pillars and the drain pillars in the second MOSFET unit, for example from the source pillar 510 and the drain pillar 520.

In an embodiment of the present disclosure, the second gate conductor 102 further comprises a gate oxidation layer 108. In an embodiment of the present disclosure, a part of the gate oxidation layer 108 is formed on sidewalls of source pillars and the drain pillars, such as the source pillar 510 and the drain pillar 520. In an embodiment of the present disclosure, the gate oxidation layer 108 separates the insulating material 107 from the source pillar 510 and the drain pillar 520.

In an embodiment of the present disclosure, the first gate conductor 101 and the third gate conductor 103 have structures similar to that of the second gate conductor 102.

In an embodiment of the present disclosure, the third gate conductor 103 comprises an insulating material 109 electrically insulating a trench-type gate 103A from the source pillars and the drain pillars in the third MOSFET unit, for example from the source pillar 530 and the drain pillar 560.

In an embodiment of the present disclosure, the third gate conductor 103 further comprises a gate oxidation layer 110. In an embodiment of the present disclosure, a part of the gate oxidation layer 110 is formed on sidewalls of source pillars and drain pillars, such as on the sidewalls of the source pillar 530. In an embodiment of the present disclosure, the gate oxidation layer 110 separates the insulating material 109 from the source pillar 530.

In an embodiment of the present disclosure, the second insulator 105 has a sidewall 105A that directly contacts the drain pillar 520 in the second MOSFET unit, and the second insulator 105 has a sidewall 105B that directly contacts the source pillar 530 in the third MOSFET unit.

In an embodiment of the present disclosure, the source pillar 510 comprises a body and a metal silicide layer 511 disposed over the body.

In an embodiment of the present disclosure, the body of the source pillar 510 comprises a well portion 512, a central portion 513 disposed over the well portion 512, and a wall portion 514 surrounding the central portion 513.

In an embodiment of the present disclosure, the well portion 512 and the central portion 513 include P-type doping. In an embodiment of the present disclosure, the central portion 513 has a higher doped concentration than the well portion 512.

In an embodiment of the present disclosure, the wall portion 514 includes N-type doping.

In an embodiment of the present disclosure, the drain pillar 520 comprises a body and a metal silicide layer 521 disposed over the body.

In an embodiment of the present disclosure, the body of the drain pillar 520 comprises a lightly doped region 523 and a heavily doped region 522 over the lightly doped region 523.

In an embodiment of the present disclosure, the body of the drain pillar 520 includes N-type doping.

In an embodiment of the present disclosure, the substrate 401 comprises a double diffusion layer 524 disposed below the drain pillar 520 and the second gate conductor 102. In an embodiment of the present disclosure, the double diffusion layer 524 includes N-type doping. In an embodiment of the present disclosure, the doping concentration of the double diffusion layer 524 varies gradually within the layer, with the doping concentration greater in the portion proximate to the drain pillar 520 than in the portion proximate to the substrate 401.

In an embodiment of the present disclosure, the double diffusion layer 524 is disposed below the second insulator 105. In an embodiment of the present disclosure, the second insulator 105 directly contacts the double diffusion layer 524.

Figure 6:
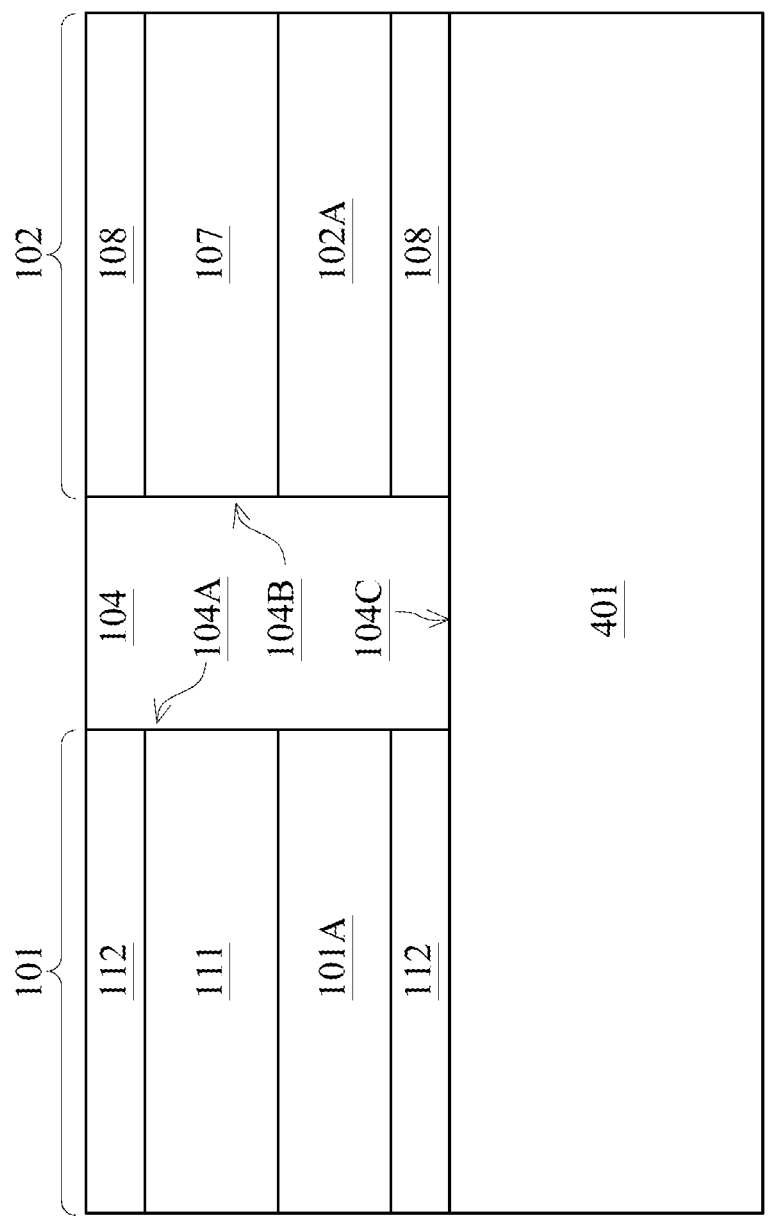
FIG. 6 is a cross-sectional view taken along line B-B' of FIG. 4 in accordance with some embodiments of the present disclosure.

Referring to FIG. 6, FIG. 6 is a cross-sectional view taken along line B-B' of FIG. 4 in accordance with some embodiments of the present disclosure.

In an embodiment of the present disclosure, the first gate conductor 101 comprises an insulating material 111 electrically insulating a trench-type gate 101A from the source pillars and the drain pillars in the first MOSFET unit.

In an embodiment of the present disclosure, the first gate conductor 101 further comprises a gate oxidation layer 112. A part of the gate oxidation layer 112 is formed on sidewalls of source pillars and drain pillars in the first MOSFET unit. The gate oxidation layer 112 separates the insulating material 111 from the source pillars and the drain pillars in the first MOSFET unit.

In an embodiment of the present disclosure, the first insulator 104 comprises a sidewall 104A that directly contacts the insulating material 111 and the gate oxidation layer 112 of the first gate conductor 101.

In an embodiment of the present disclosure, the first insulator 104 comprises a sidewall 104B that directly contacts the insulating material 107 and the gate oxidation layer 108 of the second gate conductor 102.

In an embodiment of the present disclosure, the first insulator 104 comprises a sidewall 104C directly contacting the substrate 401.

In an embodiment of the present disclosure, a part of the gate oxidation layer 112 of the first gate conductor 101 lying over the substrate 401 and below the trench-type gate 101A is coplanar with the first insulator 104. In an embodiment of the present disclosure, a part of the gate oxidation layer 108 of the second gate conductor 102 lying over the substrate 401 and below the trench-type gate 102A is coplanar with the first insulator 104.

The present disclosure provides a power MOSFET device including a multiple gated transistor disposed over a substrate. The multiple gated transistor includes a first transistor cell having a first drain pillar, a first source pillar, and a first gate conductor disposed between the first drain pillar and the first source pillar. The multiple gated transistor further includes a second transistor cell having a second drain pillar, a second source pillar, and a second gate conductor disposed between the second drain pillar and the second source pillar. The multiple gated transistor further includes a first insulator disposed over the substrate and between the first gate conductor and the second gate conductor. The first insulator electrically insulates the second gate conductor from the first gate conductor. During operation, the first transistor cell and the second transistor cell share a common source and a common drain, and conductive states of the first gate conductor and the second gate conductor are controlled separately.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the u) corresponding embodiments described herein may be utilized according to the present disclosure. Accordingly, the appended claims are intended to include within their scope such processes, machines, manufacture, compositions of matter, means, methods, or steps.

What is claimed is:

1. A power MOSFET device, comprising:
   a multiple gated transistor disposed over a substrate, comprising:
   a first transistor cell having a first drain pillar, a first source pillar, and a first gate conductor disposed between the first drain pillar and the first source pillar;
   a second transistor cell having a second drain pillar, a second source pillar, and a second gate conductor disposed between the second drain pillar and the second source pillar; and
   a first insulator disposed over the substrate and between the first gate conductor and the second gate conductor, wherein the first insulator electrically insulates the second gate conductor from the first gate conductor;
   wherein during operation, the first transistor cell and the second transistor cell share a common source and a common drain, and conductive states of the first gate conductor and the second gate conductor are controlled separately;
   wherein the first gate conductor comprises a trench-type gate surrounding the first drain pillar and the first source pillar.

2. The power MOSFET device of claim 1, wherein the first gate conductor comprises an insulating material electrically insulating the trench-type gate from the first drain pillar and the first source pillar.

3. The power MOSFET device of claim 2, wherein the first gate conductor comprises a gate oxidation layer, a part of which is formed on sidewalls of the first drain pillar and the first source pillar, wherein the gate oxidation layer separates the insulating material from the first drain pillar and the first source pillar.

4. The power MOSFET device of claim 3, wherein the first insulator comprises at least one sidewall directly contacting the insulating material and the gate oxidation layer.

5. The power MOSFET device of claim 1, wherein the first insulator comprises at least one sidewall directly contacting the substrate.

6. The power MOSFET device of claim 3, wherein a part of the gate oxidation layer of the first gate conductor lies over the substrate and is coplanar with the first insulator.

7. The power MOSFET device of claim 1, wherein the first drain pillar comprises a body and a metal silicide layer disposed over the body.

8. The power MOSFET device of claim 7, wherein the body of the first drain pillar comprises a lightly doped region and a heavily doped region over the lightly doped region.

9. The power MOSFET device of claim 8, wherein the body of the first drain pillar includes N-type doping.

10. The power MOSFET device of claim 1, wherein the substrate comprises a double diffusion layer disposed below the first drain pillar and the first gate conductor.

11. The power MOSFET device of claim 10, wherein the double diffusion layer is disposed below the first insulator.

12. The power MOSFET device of claim 2, wherein the first source pillar comprises a body and a metal silicide layer disposed over the body.

13. The power MOSFET device of claim 12, wherein the body of the first source pillar comprises a well portion, a central portion disposed over the well portion, and a wall portion surrounding the central portion.

14. The power MOSFET device of claim 13, wherein the central portion includes P-type doping, and the wall portion includes N-type doping.

15. The power MOSFET device of claim 1, wherein the first transistor cell and the second transistor cell are physically insulated by the first insulator.

16. The power MOSFET device of claim 1, further comprising a third transistor cell having a third drain pillar, a third source pillar, and a third gate conductor disposed between the third drain pillar and the third source pillar, wherein the third gate conductor is electrically insulated from the first gate conductor and the second conductor structure by a second insulator.

17. The power MOSFET device of claim 16, wherein the first insulator and the second insulator are physically connected.

18. The power MOSFET device of claim 1, further comprising a fourth transistor cell having a fourth drain pillar, a fourth source pillar, and the first gate conductor shared with the first transistor, wherein when the conductive states of the first gate conductor and the second gate conductor are both on, the fourth transistor cell and the first transistor cell together provide a resistance which is different from a resistance provided by the second transistor cell.

19. The power MOSFET device of claim 18, wherein the drain pillars and the source pillars of the first transistor cell and the fourth transistor cell are disposed over the substrate in an interlaced manner.

* * * * *